(12) United States Patent
Obata (10) Patent No.: US 10,840,140 B2
(45) Date of Patent: Nov. 17, 2020

(54) BACKSIDE WAFER DIVIDING METHOD USING WATER-SOLUBLE PROTECTIVE FILM

(71) Applicant: DISCO CORPORATION, Tokyo (JP)

(72) Inventor: Tsubasa Obata, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 0 days.

(21) Appl. No.: 16/400,186

(22) Filed: May 1, 2019

(65) Prior Publication Data
US 2019/0348325 A1 Nov. 14, 2019

(30) Foreign Application Priority Data
May 9, 2018 (JP) .................. 2018-090472

(51) Int. Cl.
*H01L 21/78* (2006.01)
*B23K 26/364* (2014.01)
*B23K 26/40* (2014.01)
*H01L 21/268* (2006.01)
*H01L 21/683* (2006.01)
*H01L 21/304* (2006.01)

(52) U.S. Cl.
CPC ............ *H01L 21/78* (2013.01); *B23K 26/364* (2015.10); *B23K 26/40* (2013.01); *H01L 21/268* (2013.01); *H01L 21/3043* (2013.01); *H01L 21/6836* (2013.01); *H01L 2221/6834* (2013.01); *H01L 2221/68327* (2013.01)

(58) Field of Classification Search
CPC ....................................................... H01L 21/78
See application file for complete search history.

(56) References Cited

U.S. PATENT DOCUMENTS

| 2015/0179538 | A1* | 6/2015 | Shinjo ................. | B23K 26/009 257/797 |
| 2015/0364375 | A1* | 12/2015 | Nakamura ............ | H01L 21/268 438/462 |
| 2016/0343614 | A1* | 11/2016 | Ogawa ................ | H01L 21/6836 |
| 2017/0025269 | A1* | 1/2017 | Ryo .................... | H01L 21/02076 |
| 2017/0140928 | A1* | 5/2017 | Iwamoto ............. | H01L 21/0206 |
| 2017/0162521 | A1* | 6/2017 | Nakamura ............ | H01L 21/268 |
| 2018/0197776 | A1* | 7/2018 | Ban ...................... | H01L 21/565 |
| 2019/0371668 | A1* | 12/2019 | Karasaki ............. | H01L 21/6836 |
| 2020/0020585 | A1* | 1/2020 | Wakahara ........... | H01L 21/3065 |

FOREIGN PATENT DOCUMENTS

| JP | 2005064231 A | 3/2005 |
| JP | 2016219564 A | 12/2016 |
| JP | 2018078162 A * | 5/2018 |

* cited by examiner

*Primary Examiner* — John P. Dulka
(74) *Attorney, Agent, or Firm* — Greer Burns & Crain, Ltd.

(57) ABSTRACT

A wafer dividing method includes a first step of cutting a back side of the wafer by using a cutting blade thereby forming a cut groove on the back side of the wafer along each division line, such that each cut groove has a depth not reaching the front side of the wafer from the back side thereof. A second step includes supplying a water-soluble liquid resin to the back side of the wafer thereby forming a water-soluble protective film on the back side of the wafer. A third step includes positioning a focal point of a laser beam on the bottom surface of each cut groove and next applying the laser beam to the bottom surface of each cut groove thereby fully cutting the wafer along each cut groove.

4 Claims, 6 Drawing Sheets

BACKSIDE WAFER DIVIDING METHOD USING WATER-SOLUBLE PROTECTIVE FILM

CROSS-REFERENCE TO RELATED APPLICATION

This application claims the benefit of Japanese Patent Application No. 2018-090472, filed May 9, 2018, which is incorporated by reference herein in its entirety.

BACKGROUND OF THE INVENTION

Field of the Invention

The present invention relates to a wafer dividing method.

Description of the Related Art

In a semiconductor wafer having a plurality of semiconductor devices such as integrated circuits (ICs) and large-scale integrations (LSIs), a functional layer forming the semiconductor devices is formed on the front side of a substrate, so as to improve the processing performance of each semiconductor device. Such a fabrication method for forming each semiconductor device from the functional layer has been put into practical use. The functional layer is formed by alternately stacking a plurality of circuit films (metal films) and a plurality of low-permittivity insulator films (low-k films) as interlayer insulating films. Each low-k film is formed from an inorganic film of SiOF, borosilicate glass (BSG) (SiOB), etc. or an organic film such as a polymer film of polyimide, parylene, etc. Since such a low-k film is very brittle, it is easily separated from the substrate in cutting the wafer by using a cutting blade. Accordingly, there has been conducted an improved processing method including the steps of applying a laser beam along both sides of each division line formed on the front side of a semiconductor wafer to form two parallel grooves along each division line, and next positioning a cutting blade between these two parallel grooves to relatively move the cutting blade and the semiconductor wafer, thereby dividing the semiconductor wafer along each division line (see Japanese Patent Laid-Open No. 2005-64231, for example).

However, it is difficult to position the cutting blade between the two parallel grooves formed along each division line by the laser beam. Further, there is a possibility that the functional layer may be separated by the cutting blade. To cope with this problem, there has been proposed a dividing method including the steps of cutting the back side of the semiconductor wafer along each division line by using a cutting blade to form a cut groove on the back side of the semiconductor wafer along each division line in a condition where the front side of the substrate (silicon substrate) is slightly left and the functional layer formed on the front side of the substrate is accordingly left, and next applying a laser beam to the back side of the wafer along each cut groove (i.e., to the bottom surface of each cut groove) to thereby fully cut the slightly left part of the substrate and the functional layer long each cut groove, thus dividing the wafer along each division line (see Japanese Patent Laid-Open No. 2016-219564, for example).

SUMMARY OF THE INVENTION

However, debris is generated in applying the laser beam to the back side of the wafer along each cut groove to thereby fully cut the slightly left part of the substrate and the functional layer along each cut groove, there is a possibility that this debris may adhere to the side surfaces of each cut groove. The debris adhered is difficult to remove by cleaning or the like.

It is therefore an object of the present invention to provide a wafer dividing method which can prevent the debris from adhering to the side surfaces of each cut groove in dividing the wafer, that is, to the side surfaces of each chip divided from the wafer.

In accordance with an aspect of the present invention, there is provided a wafer dividing method for dividing a wafer along a plurality of crossing division lines, the division lines being formed on a front side of the wafer to thereby define a plurality of separate regions where a plurality of devices are individually formed, by using cutting means having a cutting blade for cutting the wafer held on a chuck table and laser processing means for applying a laser beam to the wafer to thereby process the wafer, the laser beam having an absorption wavelength to the wafer. The wafer dividing method includes a cut groove forming step of holding the wafer through a protective tape on the chuck table, the protective tape being attached to the front side of the wafer on which the devices are formed, and cutting a back side of the wafer by using the cutting blade as relatively moving the cutting blade and the chuck table along each division line, thereby forming a cut groove on the back side of the wafer along each division line, each cut groove having a depth not reaching the front side of the wafer from the back side thereof, a protective film forming step of supplying a water-soluble liquid resin to the back side of the wafer after performing the cut groove forming step, thereby forming a water-soluble protective film on the back side of the wafer including a bottom surface and side surfaces of each cut groove, a laser cutting step of positioning a focal point of the laser beam on the bottom surface of each cut groove after performing the protective film forming step, and next applying the laser beam to the bottom surface of each cut groove on which the water-soluble protective film is formed along each cut groove in a condition where the back side of the wafer is exposed upward, thereby fully cutting the wafer along each cut groove, and a protective film removing step of spraying cleaning water to the back side of the wafer after performing the laser cutting step, thereby dissolving the water-soluble protective film in the cleaning water to remove the water-soluble protective film from the back side of the wafer.

Preferably, the wafer dividing method further includes a preparing step of preparing a work set before performing the cut groove forming step, the work set being composed of the wafer, a ring frame having an inside opening for accommodating the wafer, and the protective tape attached to the front side of the wafer located in the inside opening of the ring frame in the condition where a peripheral portion of the protective tape is supported to the ring frame. The protective film forming step includes an inverted frustoconical space forming step of positioning the ring frame of the work set at a level higher than that of the wafer to thereby form an inverted frustoconical space as defined by the wafer, the protective tape, and the ring frame in such a manner that a base of the inverted frustoconical space is formed by the wafer, and a side wall of the inverted frustoconical space is formed by the protective tape, an immersing step of supplying water into the inverted frustoconical space to store the water in the inverted frustoconical space until the wafer is immersed in the water stored in the inverted frustoconical space, a resin film forming step of supplying a water-soluble liquid resin in the form of drops into the water stored in the inverted frustoconical space in the immersing step, the water-soluble liquid resin having a specific gravity larger than that of the water, thereby spreading the water-soluble liquid resin over the back side of the wafer including each cut groove to form a resin film, and a draining step of positioning the ring frame at a level lower than that of the wafer after performing the resin film forming step to thereby drain the water stored in the inverted frustoconical space in the immersing step, thereby forming the water-soluble protective film from the resin film formed on the back side of the wafer.

According to the wafer dividing method of the present invention, it is possible to prevent that debris may adhere to the side surfaces of each chip divided from the wafer.

Furthermore, the water-soluble protective film can also be formed more reliably on the bottom surface and side surfaces of each cut groove formed on the back side of the wafer in a case in which the wafer dividing method further includes the preparing step of preparing a work set before performing the cut groove forming step, the work set being composed of the wafer, a ring frame having an inside opening for accommodating the wafer, and the protective tape attached to the front side of the wafer located in the inside opening of the ring frame in a condition where the peripheral portion of the protective tape is supported to the ring frame and in a case in which the protective film forming step includes the inverted frustoconical space forming step of positioning the ring frame of the work set at a level higher than that of the wafer to thereby form an inverted frustoconical space as defined by the wafer, the protective tape, and the ring frame in such a manner that the base of the space is formed by the wafer, and the side wall of the space is formed by the protective tape, the immersing step of supplying water into the space to store the water in the space until the wafer is immersed in the water stored in the space, the resin film forming step of supplying a water-soluble liquid resin in the form of drops into the water stored in the space in the immersing step, the liquid resin having a specific gravity larger than that of the water, thereby spreading the liquid resin over the back side of the wafer including each cut groove to form a resin film, and the draining step of positioning the ring frame at a level lower than that of the wafer after performing the resin film forming step to thereby drain the water stored in the space in the immersing step, thereby forming the water-soluble protective film from the resin film formed on the back side of the wafer.

The above and other objects, features, and advantages of the present invention and the manner of realizing them will become more apparent, and the invention itself will best be understood from a study of the following description and appended claims with reference to the attached drawings illustrating a preferred embodiment of the invention.

DETAILED DESCRIPTION OF THE PREFERRED EMBODIMENT

Figure 1:
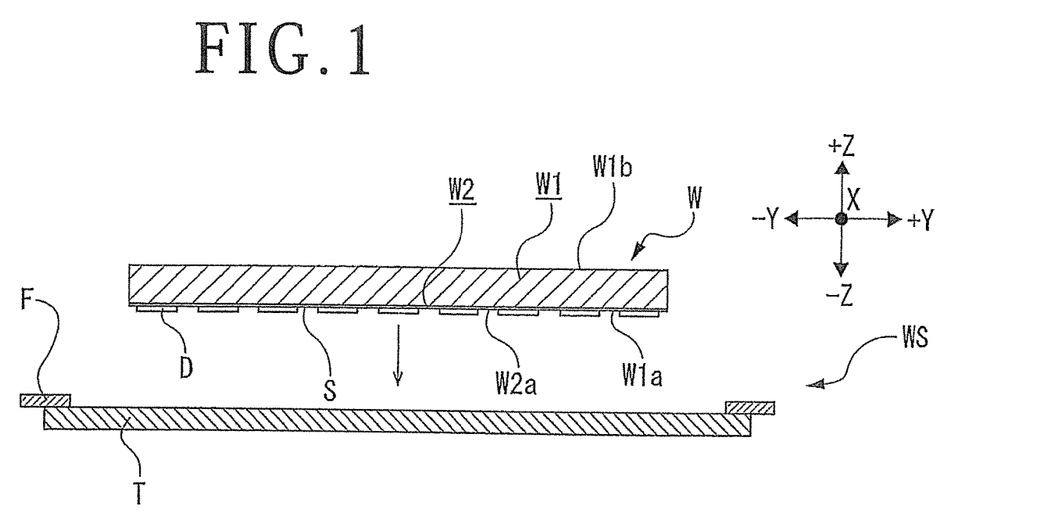
FIG. 1 is a sectional view illustrating a preparing step of preparing a work set including a wafer, a protective tape, and a ring frame.

A wafer dividing method according to a preferred embodiment of the present invention will now be described with reference to the attached drawings. Referring to FIG. 1, there is illustrated a wafer W including a substrate W1 formed of silicon, for example. The wafer W is a disk-shaped semiconductor wafer, for example. The substrate W1 has a front side W1a and a back side W1b. In FIG. 1, the front side W1a of the substrate W1 is oriented downward. A functional layer W2 is formed on the front side W1a of the substrate W1. The functional layer W2 is composed of a plurality of low-permittivity insulator films (low-k films) and a plurality of metal foils, which are alternately stacked. A plurality of devices D are formed like a matrix from the functional layer W2. The functional layer W2 has a front side W2a, which is also the front side of the wafer W. A plurality of crossing division lines S are set on the front side W2a of the wafer W (i.e., the front side W2a of the functional layer W2) to thereby define a plurality of separate regions where the plural devices D are individually formed. The plural division lines S are composed of a plurality of division lines S extending in a first direction and a plurality of division lines S extending in a second direction perpendicular to the first direction. The substrate W1 may be formed of any materials other than silicon, such as gallium arsenide, sapphire, gallium nitride, or silicon carbide.

(1) Preparing Step

In this preferred embodiment, a circular protective tape T larger in diameter than the wafer W is attached to the front side W2a of the wafer W in a condition where a peripheral portion of the protective tape T is supported to a ring frame F having an inside opening (circular opening) for accommodating the wafer W. The protective tape T functions to protect the front side W2a of the wafer W. Accordingly, all of the wafer W, the protective tape T, and the ring frame F are united to form a work set WS. That is, the inside opening of the ring frame F is closed by a central portion of the protective tape T, and the front side W2a of the wafer W is attached to this central portion of the protective tape T so as to be located in the inside opening of the ring frame F. Thus, the work set WS composed of the wafer W, the protective tape T, and the ring frame F is prepared. As a modification, the ring frame F may not be used to prepare a similar work set. That is, a circular protective tape having substantially the same diameter as that of the wafer W may be used, and the front side W2a of the wafer W may be attached to this protective tape in a condition where the center of the wafer W substantially coincides with the center of the protective tape. In this case, the work set is composed of the wafer W and this protective tape. Also in this case, the front side W2a of the wafer W is protected by this protective tape.

The circular protective tape T is an expandable adhesive tape having an adhesive surface, and it is larger in diameter than the wafer W. In the preparing step, the wafer W and the ring frame F are first set in position in such a manner that the wafer W is located in the inside opening of the ring frame F. At this time, the wafer W and the ring frame F are positioned such that the center of the wafer W substantially coincides with the center of the inside opening of the ring frame F. After positioning the wafer W and the ring frame F, the adhesive surface of the protective tape T is attached in its central portion to the front side W2a of the wafer W. Further, the adhesive surface of the protective tape T in its peripheral portion is attached to the ring frame F in such a manner that the central portion of the protective tape T closes the inside opening of the ring frame F. Accordingly, the wafer W is supported through the protective tape T to the ring frame F, thereby forming the work set WS (see FIG. 2). In this condition, the back side W1b of the wafer W (i.e., the back side W1b of the substrate W1) is exposed upward.

The attachment of the protective tape T to the wafer W may be performed by using a tape mounter (not illustrated) having a roller, in which the roller is rotated about its axis to press the protective tape T on the wafer W. Alternatively, the attachment of the protective tape T to the wafer W may be manually performed by an operator.

(2) Cut Groove Forming Step

Figure 2:
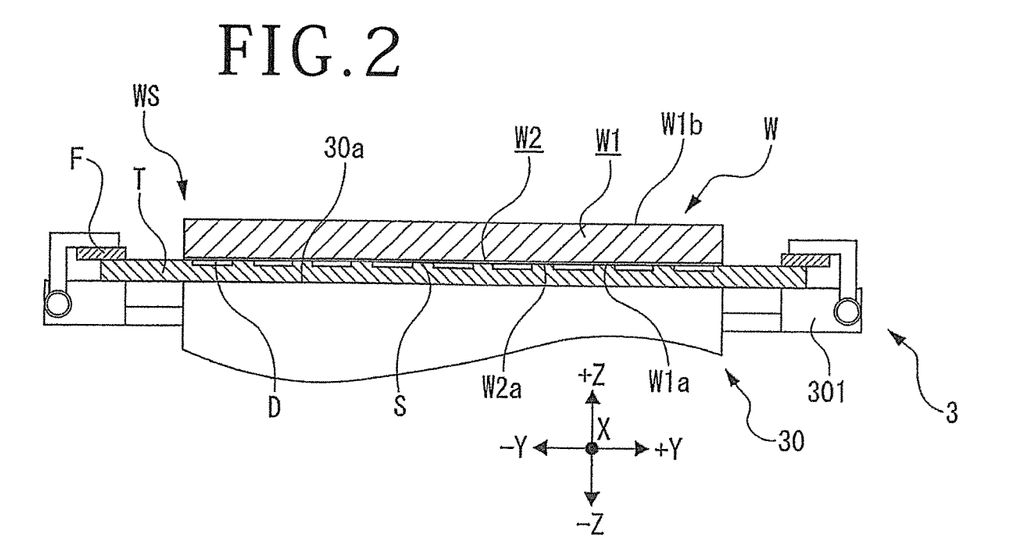
FIG. 2 is a sectional view illustrating a condition where the wafer is held through the protective tape on a chuck table of a cutting apparatus for use in a cut groove forming step.

The work set WS is next transferred to a chuck table 30 in a cutting apparatus 3 illustrated in FIG. 2. The chuck table 30 illustrated in FIG. 2 has a circular disk-shaped holding surface 30a for holding the wafer W under suction. The holding surface 30a of the chuck table 30 is connected to a vacuum source (not illustrated) for producing a suction force. A plurality of (e.g., four) clamps 301 for holding the ring frame F are provided on the outer circumference of the chuck table 30 at equal intervals in the circumferential direction of the chuck table 30. The chuck table 30 is rotatable about its axis extending in the Z direction (cutter feeding direction), i.e., both in the +Z direction illustrated by an arrow +Z in FIG. 2 and in the −Z direction illustrated by an arrow −Z in FIG. 2. Further, the chuck table 30 is movable in the X direction (work feeding direction), i.e., both in the +X direction perpendicular to the sheet plane of FIG. 2 toward the front side thereof and in the −X direction perpendicular to the sheet plane of FIG. 2 toward the back side thereof.

As illustrated in FIG. 2, the wafer W is placed through the protective tape T on the holding surface 30a of the chuck table 30. Thereafter, the suction force produced by the vacuum source is transmitted to the holding surface 30a to thereby hold the wafer W through the protective tape T on the holding surface 30a under suction. Further, the ring frame F is fixed by the clamps 301.

Figure 3:
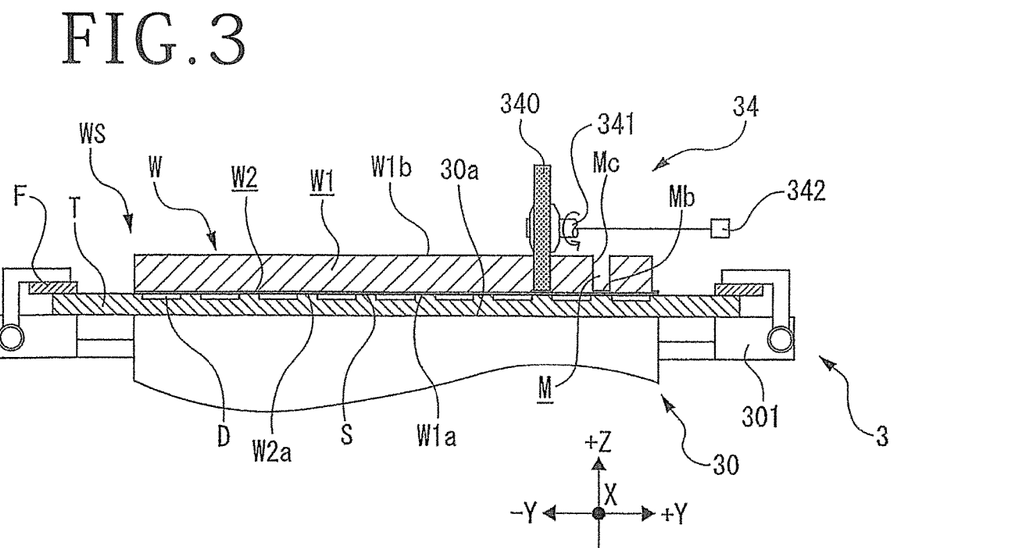
FIG. 3 is a sectional view illustrating the cut groove forming step of using a cutting blade to cut the back side of the wafer and thereby form a cut groove not fully cutting the wafer.

As illustrated in FIG. 3, the cutting apparatus 3 includes cutting means 34 having a circular cutting blade 340, a spindle 341, and a motor 342. The wafer W held on the chuck table 30 under suction is next cut by the cutting blade 340 of the cutting means 34 in a condition where the back side W1b of the wafer W is exposed upward. That is, the back side W1b of the wafer W is cut by the cutting blade 340. The cutting blade 340 is mounted on the spindle 341 having an axis extending in the Y direction perpendicular to the X direction on a horizontal plane, i.e., both in the +Y direction illustrated by an arrow +Y in FIG. 3 and in the −Y direction illustrated by an arrow −Y in FIG. 3. The motor 342 is connected to the spindle 341 to rotationally drive the spindle 341. Accordingly, when the spindle 341 is rotated by the motor 342, the cutting blade 340 is also rotated at a high speed about the axis of the spindle 341 extending in the Y direction. The cutting means 34 is movable both in the Y direction and in the Z direction by moving means (not illustrated). That is, the cutting means 34 is adapted to be indexed in the Y direction and adapted to be fed in the Z direction.

Prior to cutting the wafer W, the chuck table 30 holding the work set WS is moved in the −X direction toward the back side of the sheet plane of FIG. 3. During this movement of the chuck table 30, an infrared camera (not illustrated) is operated to apply infrared light through the back side W1b of the wafer W and thereby image the front side W2a of the wafer W including the division lines S. According to an image obtained by the infrared camera, image processing such as pattern matching is performed to detect the coordinate positions of the division lines S. Thereafter, the cutting blade 340 is indexed in the Y direction according to the detected position of a predetermined one of the division lines S extending in the first direction. The first direction of the division lines S is previously made parallel to the X direction by suitably rotating the chuck table 30. In this manner, the cutting blade 340 is aligned with the predetermined division line S extending in the first direction parallel to the X direction.

Thereafter, the spindle 341 is rotated at a high speed to rotate the cutting blade 340 in a clockwise direction as viewed from the left side illustrated by the arrow −Y in FIG. 3, for example. Further, the cutting means 34 is moved in the −Z direction down to a predetermined vertical position until the lowermost end of the cutting blade 340 becomes a predetermined vertical position slightly above the front side W1a of the substrate W1.

After thus setting the vertical position of the cutting means 34, the chuck table 30 is moved in the −X direction toward the back side of the sheet plane of FIG. 3 at a predetermined feed speed. As a result, the cutting blade 340 being rotated is relatively moved to cut the substrate W1 along the predetermined division line S in the condition where the back side W1b of the wafer W is exposed upward, thereby forming a cut groove M on the back side W1b of the wafer W along the predetermined division line S, in which the cut groove M has a depth not reaching the functional layer W2 illustrated in FIG. 3. That is, the wafer W is not fully cut by the cut groove M. As a result, the cut groove M has a bottom surface Mb, and a thin part of the substrate W1 is left between the bottom surface Mb of the cut groove M and the functional layer W2. In this manner, the functional layer W2 is not cut by the cutting blade 340, so that there is no possibility that the functional layer W2 may be separated.

When the wafer W is fed to a predetermined position in the X direction to finish the cutting operation along the predetermined division line S by the cutting blade 340, the cutting blade 340 is raised away from the wafer W. Thereafter, the wafer W is moved back to an original position in the +X direction toward the front side of the sheet plane of FIG. 3. Thereafter, the cutting blade 340 is moved in the −Y direction by the pitch of the adjacent division lines S, and the cutting operation by the cutting blade 340 is similarly performed along the next division line S extending in the first direction parallel to the X direction. Thereafter, such an indexing operation and a cutting operation are repeatedly performed along all the other division lines S extending in the first direction. Thereafter, the wafer W is rotated 90 degrees to similarly perform the indexing operation and the cutting operation along all the other division lines S extending in the second direction perpendicular to the first direction. As a result, a plurality of cut grooves M not fully cutting the wafer W are formed on the back side W1b of the wafer W along all the crossing division lines S.

(3-1) Inverted Frustoconical Space Forming Step in Protective Film Forming Step

After performing the cut groove forming step as described above, a protective film forming step is performed in such a manner that a water-soluble liquid resin is supplied to the back side W1b of the wafer W illustrated in FIG. 3 to thereby form a water-soluble protective film on the back side W1b of the wafer W including the bottom surface Mb of each cut groove M and a pair of opposed side surfaces Mc of each cut groove M. The protective film forming step in this preferred embodiment includes an inverted frustoconical space forming step, immersing step, resin film forming step, and draining step. In a case in which the wafer W is not supported by the ring frame F, a water-soluble liquid resin is applied to the back side W1b of the wafer W by spin coating to thereby form a protective film.

Figure 4:
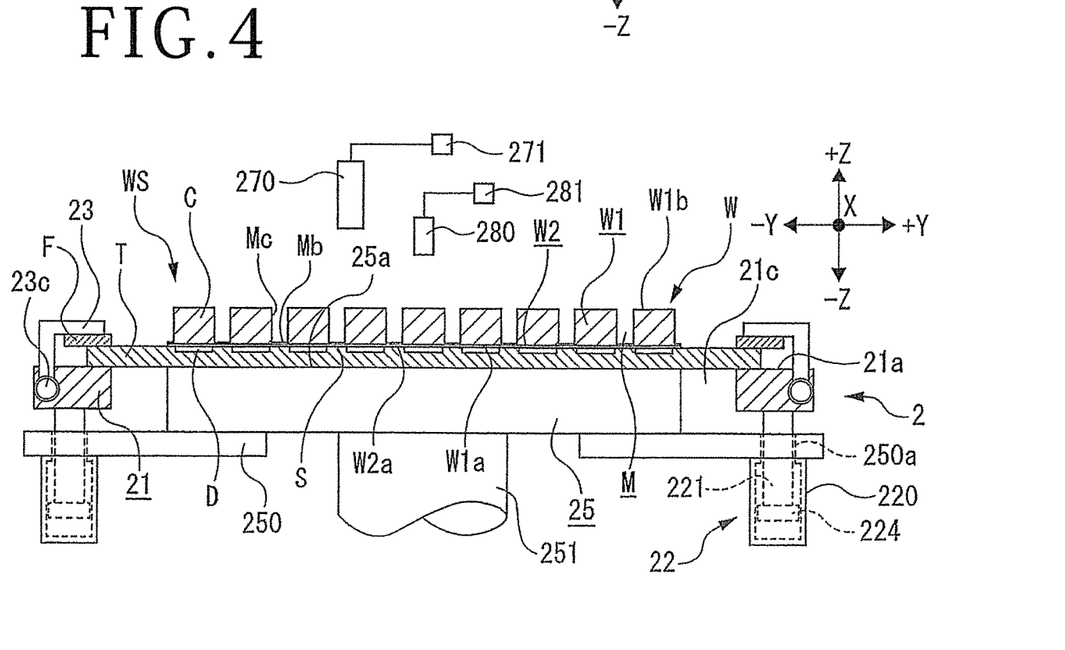
FIG. 4 is a sectional view illustrating a condition where the work set is placed on a holding table of a protective film forming apparatus for use in a protective film forming step of forming a water-soluble protective film on the back side of the wafer.

The inverted frustoconical space forming step in the protective film forming step is performed in the following manner. The wafer W with the cut grooves M formed on the back side W1b is transferred to a protective film forming apparatus 2 illustrated in FIG. 4. The protective film forming apparatus 2 includes an annular table 21 having a circular inside opening 21c. The outer diameter of the annular table 21 is larger than the diameter of the protective tape T, and the diameter of the inside opening 21c of the annular table 21 is smaller than the diameter of the protective tape T. A plurality of (e.g., four) clamps 23 are provided on the outer circumference of the annular table 21 at equal intervals in the circumferential direction thereof. Only two of the four clamps 23 are illustrated in FIG. 4. Each clamp 23 is rotatably supported to a rotating shaft 23c and adapted to be rotated about the axis of the rotating shaft 23c by a rotary actuator or the like. That is, each clamp 23 can be rotated by the rotation of the rotating shaft 23c. The annular table 21 has an upper surface as a holding surface 21a, and the ring frame F is adapted to be held between the holding surface 21a and each clamp 23.

The annular table 21 is vertically movable by a plurality of elevating means 22 provided below the annular table 21 at equal intervals in the circumferential direction thereof. Each elevating means 22 is configured by an air cylinder, which includes a cylinder tube 220 having a cylindrical shape with a closed lower end, a piston 224 movably provided in the cylinder tube 220, and a piston rod 221 inserted in the cylinder tube 220 and having a lower end connected to the piston 224. The piston rod 221 has an upper end fixed to the lower surface of the annular table 21. When air is supplied to (or removed from) each cylinder tube 220, the pressure in each cylinder tube 220 is changed, so that each piston rod 221 is moved in the Z direction to thereby move the annular table 21 in the Z direction.

A disk-shaped holding table 25 is provided in the inside opening 21c of the annular table 21 in a condition where the vertical position of the holding table 25 is fixed. The center of the annular table 21 substantially coincides with the center of the holding table 25. The holding table 25 has an upper surface as a holding surface 25a, which is connected to a vacuum source (not illustrated). Accordingly, the wafer W is adapted to be held on the holding surface 25a of the holding table 25 under suction. As a modification, the elevating means 22 may be replaced by an elevating mechanism provided on the side surface (circumferential surface) of the holding table 25 for vertically moving the annular table 21 and the clamps 23 as a unit.

A plurality of fixing plates 250 extending horizontally are provided below the holding table 25 at equal intervals in the circumferential direction thereof. The upper surface of each fixing plate 250 at its one end portion is fixed to the lower surface of the holding table 25 at its peripheral portion. A through hole 250a is formed at the other end portion of each fixing plate 250 so as to extend through the thickness of each fixing plate 250. Each piston rod 221 is vertically movably inserted through the through hole 250a of each fixing plate 250. The lower surface of each fixing plate 250 at its other end portion is fixed to the upper end surface of each cylinder tube 220. Accordingly, when each piston rod 221 is raised to raise the annular table 21, the holding table 25 fixed in vertical position becomes lower in level than the annular table 21.

A rotating shaft 251 having an axis extending in the Z direction is connected to the lower surface of the holding table 25 at its center. The rotating shaft 251 is rotatable about its axis by a rotational drive source such as a motor (not illustrated). Accordingly, when the rotating shaft 251 is rotated, all of the holding table 25, the plural elevating means 22, and the annular table 21 are rotated together about the axis of the rotating shaft 251.

A cleaning water nozzle 270 capable of spraying cleaning water is provided above the holding table 25. The cleaning water nozzle 279 is horizontally movable from an operational position above the holding table 25 to a retracted position. The cleaning water nozzle 270 is connected to a cleaning water source 271 storing cleaning water such as pure water.

Further, a liquid resin nozzle 280 capable of supplying a water-soluble liquid resin in the form of drops is also provided above the holding table 25. The liquid resin nozzle 280 is also horizontally movable from an operational position above the holding table 25 to a retracted position. The liquid resin nozzle 280 is connected to a liquid resin source 281 storing a water-soluble liquid resin such as polyvinyl pyrrolidone (PVP) and polyvinyl alcohol (PVA). For example, HogoMax manufactured by Disco Corporation may be used as the water-soluble liquid resin.

In the inverted frustoconical space forming step, the ring frame F is first placed through the protective tape T on the holding surface 21a of the annular table 21. Thereafter, the clamps 23 are rotated by rotating the rotating shaft 23c to hold the ring frame F between each clamp 23 and the holding surface 21a of the annular table 21. In this condition, the holding surface 21a of the annular table 21 is at the same level as that of the holding surface 25a of the holding table 25. The wafer W is held under suction through the protective tape T on the holding surface 25a of the holding table 25.

Figure 5:
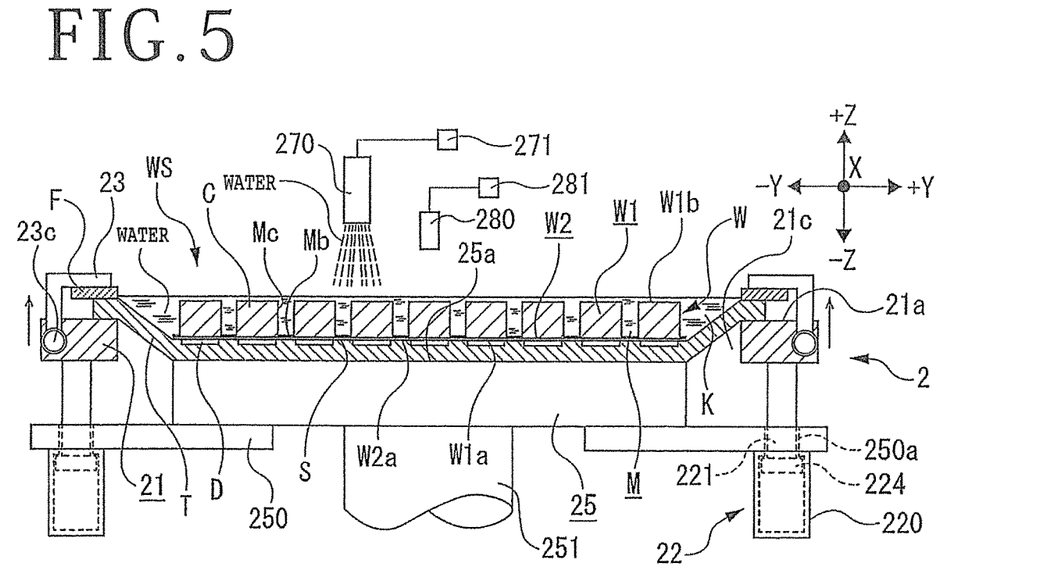
FIG. 5 is a sectional view illustrating an inverted frustoconical space forming step and an immersing step constituting the protective film forming step.

As illustrated in FIG. 5, each elevating means 22 is operated to raise the annular table 21 in a condition where the ring frame F is held between each clamp 23 and the holding surface 25a. As a result, the holding table 25 holding the wafer W under suction is relatively lowered with respect to the clamps 23. Accordingly, the protective tape T is expanded radially outward in its annular area defined between the inner circumference of the ring frame F and the outer circumference of the wafer W. As a result, the ring frame F of the work set WS is positioned at a level higher than that of the wafer W, thereby forming an inverted frustoconical space K as defined by the wafer W, the protective tape T, and the ring frame F. That is, the base of the inverted frustoconical space K is formed by the wafer W, and the side wall of the inverted frustoconical space K is formed by the protective tape T.

(3-2) Immersing Step in Protective Film Forming Step

Thereafter, the cleaning water nozzle 270 is positioned above the wafer W. In this condition, water is supplied from the cleaning water nozzle 270 toward the wafer W and is thereby stored into the inverted frustoconical space K. When the level of the surface of the water stored in the inverted frustoconical space K becomes higher than the level of the back side W1b of the wafer W, the supply of the water from the cleaning water nozzle 270 into the inverted frustoconical space K is stopped. Accordingly, the whole of the wafer W is immersed in the water stored in the inverted frustoconical space K.

While the inverted frustoconical space K is first formed and the water is next stored into the space K in this preferred embodiment, a modification may be made in the following manner. In this modification, the holding table 25 is not used and the ring frame F of the work set WS is held by the annular table 21 and the clamps 23 in a condition where the wafer W of the work set WS is not held. In this condition, water is supplied to the wafer W until the protective tape T is deformed by the weight of the water supplied and the weight of the wafer W. As a result, a similar inverted frustoconical space can be formed, and at the same time, the wafer W can be immersed in the water stored in this space.

(3-3) Resin Film Forming Step in Protective Film Forming Step

Figure 6:
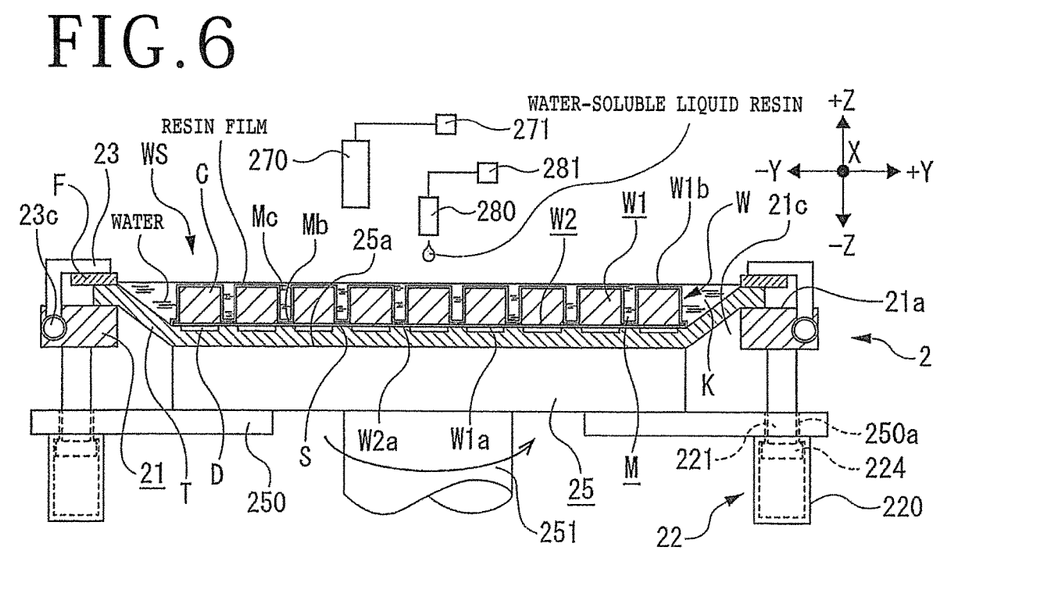
FIG. 6 is a sectional view illustrating a resin film forming step constituting the protective film forming step.

After the whole of the wafer W is immersed in the water stored in the space K, the liquid resin nozzle 280 is positioned above the surface of the water stored in the space K. As illustrated in FIG. 6, a water-soluble liquid resin is supplied from the liquid resin source 281 to the liquid resin nozzle 280, and a predetermined amount of water-soluble liquid resin is supplied in the form of drops from the liquid resin nozzle 280 to the center of the surface of the water stored in the space K. Since a specific gravity of the water-soluble liquid resin supplied is larger than that of the water, the liquid resin is dissolved in the water as sinking. Accordingly, the liquid resin spreads along the back side W1b of the wafer W forming the base of the space K, thereby forming a resin film on the whole of the back side W1b of the wafer W. Further, the liquid resin also enters each cut groove M formed on the back side W1b of the wafer W. This liquid resin in each cut groove M spreads along the opposed side surfaces Mc of each cut groove M so as to extend downward to the bottom surface Mb of each cut groove M. Further, the liquid resin in each cut groove M also spreads along the bottom surface Mb of each cut groove M. Accordingly, the resin film is formed on the whole of the back side W1b of the wafer W including the side surfaces Mc and the bottom surface Mb of each cut groove M. The spread of the resin film on the side surfaces Mc and the bottom surface Mb of each cut groove M may be effected in the subsequent draining step.

(3-4) Draining Step in Protective Film Forming Step

Figure 7:
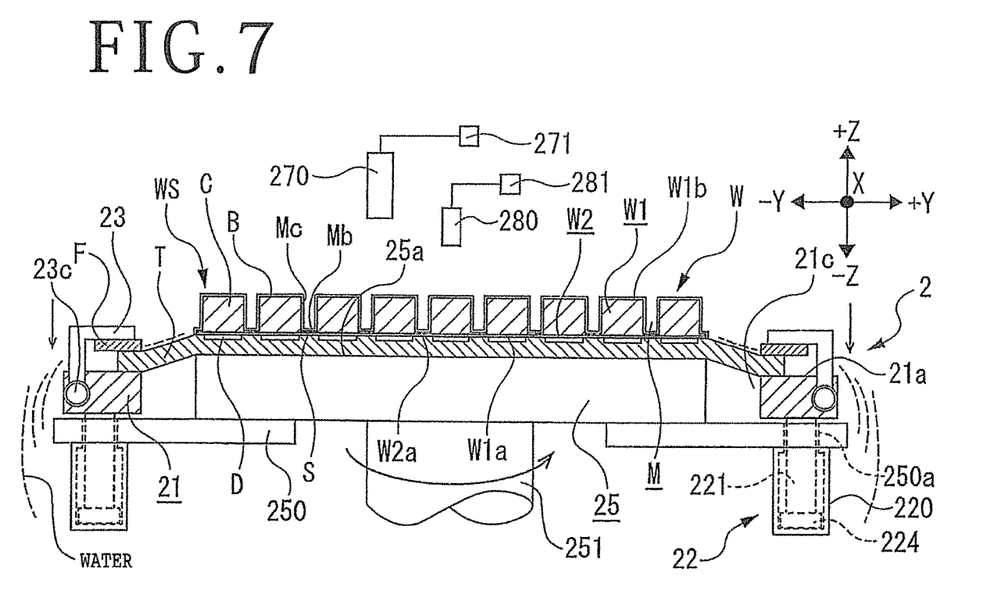
FIG. 7 is a sectional view illustrating a draining step constituting the protective film forming step.

After the resin film is formed in the water stored in the space K as mentioned above, each elevating means 22 is operated to slowly lower the annular table 21 as illustrated in FIG. 7, so that the holding table 25 holding the wafer W under suction is relatively raised with respect to the clamps 23. Accordingly, the water stored in the space K is allowed to flow out of the space K in a radially outward direction. That is, the water in the space K flows out over the protective tape T, the ring frame F, and the annular table 21 to the outside of the protective film forming apparatus 2. Thus, the water in the space K is drained. In this manner, the ring frame F of the work set WS is lowered to the position lower than the wafer W, so that the space K is lost and the water stored in the space K is completely drained.

As the result of this draining, the resin film spread over the upper surface (the back side W1b) of the wafer W forming the base of the space K is left on the back side W1b of the wafer W to thereby form a water-soluble protective film B. That is, as illustrated in FIG. 7, the resin film left on the bottom surface Mb of each cut groove M, the side surfaces Mc of each cut groove M (opposed side surfaces of adjacent chips C), and the upper surface of each chip C is dried to form the water-soluble protective film B.

After the water-soluble protective film B is formed on the back side W1b of the wafer W as mentioned above, each elevating means 22 is operated again to raise the annular table 21 until the level of the holding surface 21a of the annular table 21 becomes substantially the same as the level of the holding surface 25a of the holding table 25.

As a modification, the rotating shaft 251 may be rotated to rotate the work set WS held on the annular table 21, thereby draining the water stored in the space K. In this modification, the ring frame F of the work set WS is held on the annular table 21 by using the clamps 23. Thereafter, water is supplied to the wafer W, and the protective tape T is deformed by the weight of the water supplied and the weight of the wafer W, so that the wafer W is immersed in the water stored in the space K. Thereafter, the water-soluble liquid resin is supplied into the water stored in the space K. Thereafter, the rotating shaft 251 is rotated to rotate the annular table 21, thereby draining the water stored in the space K. Accordingly, the water-soluble protective film B can be similarly formed on the back side W1b of the wafer W including the cut grooves M. In this modification, the water is drained by rotating the work set Ws. Accordingly, each elevating means 22 and the holding table 25 may be excluded.

In the case of forming a protective film on the bottom surface Mb and the side surfaces Mc of each cut groove M formed on the wafer W, there is a problem in a method using spin coating as in the prior art. That is, it is difficult to form a protective film on the bottom surface Mb and the side surfaces Mc unless a large amount of water-soluble liquid resin is supplied to the wafer W. Further, even if a large amount of water-soluble liquid resin is supplied, there is another problem such that it is difficult to make the liquid resin reach the inside of each cut groove M, so that the protective film cannot be formed on the whole of the bottom surface Mb and the side surfaces Mc.

To the contrary, the wafer dividing method according to the present invention includes the preparing step of preparing the work set WS before performing the cut groove forming step, the work set WS being composed of the wafer W, the ring frame F having the inside opening for accommodating the wafer W, and the protective film T attached to the front side W2a of the wafer W located in the inside opening of the ring frame F in a condition where a peripheral portion of the protective tape T is supported to the ring frame F. Furthermore, the protective film forming step includes the inverted frustoconical space forming step of positioning the ring frame F of the work set WS at the level higher than that of the wafer W to thereby form the inverted frustoconical space K as defined by the wafer W, the protective tape T, and the ring frame F in such a manner that the base of the inverted frustoconical space K is formed by the wafer W, and the side wall of the inverted frustoconical space K is formed by the protective tape T. The protective film forming step further includes the immersing step of supplying water into the inverted frustoconical space K to store the water in the space K until the wafer W is immersed in the water stored in the space K. The protective film forming step further includes the resin film forming step of supplying the water-soluble liquid resin in the form of drops into the water stored in the space K in the immersing step, the liquid resin having a specific gravity larger than that of the water, thereby spreading the liquid resin over the back side W1b of the wafer W including the cut grooves M to form the resin film. The protective film forming step further includes the draining step of positioning the ring frame F at the level lower than that of the wafer W after performing the resin film forming step to thereby drain the water stored in the space K in the immersing step, thereby forming the water-soluble protective film B from the resin film formed on the back side W1b of the wafer W. With this configuration, it is unnecessary to supply a large amount of water-soluble liquid resin to the wafer W, and the water-soluble protective film B can be formed more reliably on the bottom surface Mb and the side surfaces Mc of each cut groove M formed on the back side W1b of the wafer W.

(4) Laser Cutting Step

Figure 8:
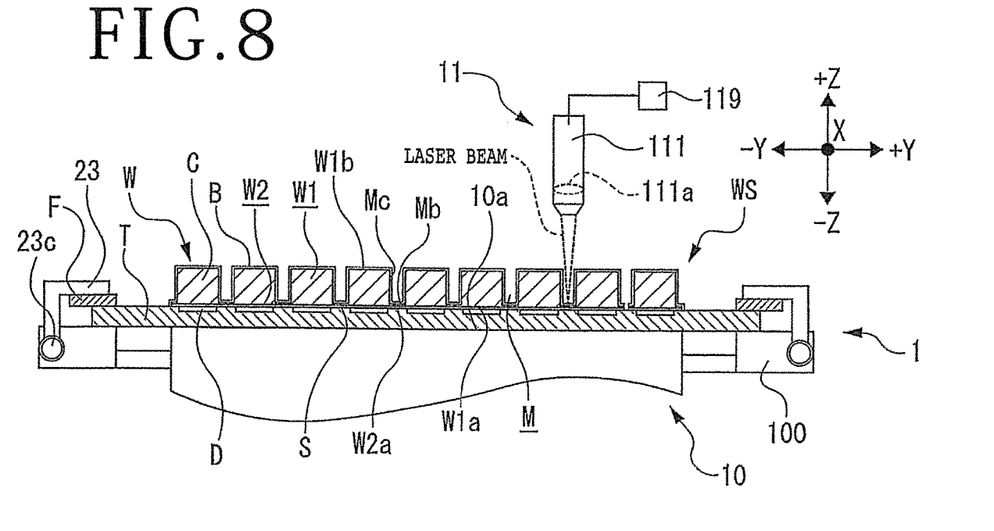
FIG. 8 is a sectional view illustrating a laser cutting step of using a laser beam to fully cutting the wafer.

After the water-soluble protective film B is formed on the back side W1b of the wafer W as mentioned above, the wafer W (the work set WS) is transferred to a laser processing apparatus 1 illustrated in FIG. 8. The laser processing apparatus 1 includes at least a chuck table 10 for holding the wafer W under suction and laser beam applying means 11 for applying a laser beam to the wafer W held on the chuck table 10, the laser beam having an absorption wavelength to the wafer W.

The chuck table 10 has a circular upper surface as a horizontal holding surface 10a for holding the wafer W under suction. The holding surface 10a is formed from a porous member, for example. The chuck table 10 has a rotation axis extending in a vertical direction (Z direction). That is, the chuck table 10 is rotatable about its vertical axis. Further, the chuck table 10 is movable both in the X direction and in the Y direction by any moving means (not illustrated). A plurality of (e.g., four) clamps 100 are provided on the outer circumference of the chuck table 10 at equal intervals in the circumferential direction thereof. In FIG. 8, only two of the four clamps 100 are illustrated.

The laser beam applying means 11 includes a laser oscillator 119 such as an yttrium aluminum garnet (YAG) laser and an yttrium orthovanadate (YVO4) laser for oscillating a laser beam having an absorption wavelength to the wafer W and focusing means 111 having a focusing lens 111a for focusing the laser beam oscillated from the laser oscillator 119 and next transmitted through an optical system (not illustrated). Accordingly, the laser beam can be accurately focused and applied from the focusing means 111 to the wafer W held on the chuck table 10 at a predetermined height. The focal position of the laser beam to be focused by the focusing means 111 can be adjusted by focal position adjusting means (not illustrated) in such a manner that the focal position is adjusted in a direction (vertical direction) perpendicular to the holding surface 10a of the chuck table 10.

In the laser cutting step, the wafer W of the work set WS is first held under suction through the protective tape T on the holding surface 10a of the chuck table 10. Further, the ring frame F of the work set WS is fixed by the clamps 100. Thereafter, the position of each cut groove M as a reference in applying the laser beam to the wafer W is detected by alignment means (not illustrated). That is, the alignment means includes imaging means for imaging the cut grooves M formed on the back side W1b of the wafer W and control means for performing image processing such as pattern matching according to an image obtained by the imaging means, thereby detecting the coordinate position of each cut groove M on the wafer W.

As the result of this detection of each cut groove M, the chuck table 10 is moved in the Y direction to align a predetermined one of the cut grooves M formed along the division lines S extending in the first direction with the focusing means 111 of the laser beam applying means 11. Thereafter, the focal position of the laser beam to be focused by the focusing lens 111a is adjusted to the height of the bottom surface Mb of the predetermined cut groove M. Thereafter, the laser oscillator 119 is operated to oscillate the laser beam having an absorption wavelength to the wafer W. As a result, the laser beam oscillated is focused by the focusing means 111 and applied to the wafer W from the back side W1b thereof. That is, the laser beam is focused on the bottom surface Mb of the predetermined cut groove M. At the same time, the wafer W held on the chuck table 10 is moved in the −X direction (forward direction) toward the back side of the sheet plane of FIG. 8 at a predetermined feed speed. Accordingly, the laser beam is applied along the predetermined cut groove M to the bottom surface Mb thereof, so that all of the water-soluble protective film B formed on the bottom surface Mb, the thin part of the substrate W1 left below the bottom surface Mb, and the functional layer W2 formed below this thin part of the substrate W1 are melted by the laser beam to thereby fully cut the wafer W along the predetermined cut groove M.

When the wafer W is moved in the −X direction as mentioned above to reach a predetermined position, the application of the laser beam is stopped and the chuck table 10 is next moved (indexed) by the pitch of the division lines S in the −Y direction to align the focusing means 111 with the next cut groove M adjacent to the predetermined cut groove M. Thereafter, the wafer W is moved in the +X direction (backward direction) toward the front side of the sheet plane of FIG. 8. At the same time, the laser beam is applied again along this next cut groove M to the bottom surface Mb thereof. As a result, the wafer W is also fully cut along this next cut groove. While debris is generated by the application of the laser beam, this debris is blocked by the water-soluble protective film B to thereby prevent direct adherence of the debris to the side surfaces Mc and the bottom surface Mb of each cut groove M.

In a case in which the wafer W is not fully cut along each cut groove M by one pass of the application of the laser beam in one direction, the laser beam is applied by a plurality of passes in opposite directions along each cut groove M, thereby fully cutting the wafer W along each cut groove M.

Such an indexing operation and a laser cutting operation are repeated along all the other cut grooves M extending in the first direction parallel to the X direction. Thereafter, the chuck table 10 is rotated 90 degrees to similarly perform the indexing operation and the laser cutting operation along all the other cut grooves M extending in the second direction perpendicular to the first direction. As a result, the wafer W can be divided into individual chips C each having the device D.

(5) Protective Film Removing Step

Figure 9:
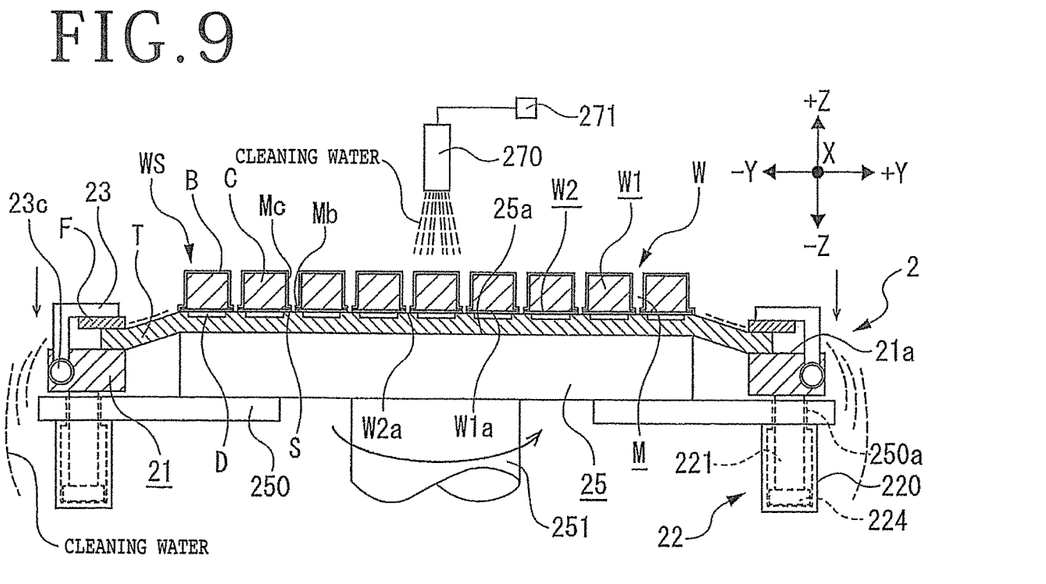
FIG. 9 is a sectional view illustrating a protective film removing step of removing the water-soluble protective film from the back side of the wafer.

After performing the laser cutting step, the wafer W divided into the chips C and still kept in attachment to the protective tape T is transferred to a protective film forming apparatus 2 illustrated in FIG. 9, which is the same as the apparatus 2 illustrated in FIG. 4. In the protective film forming apparatus 2, cleaning water is sprayed to the back side W1b of the wafer W to dissolve the water-soluble protective film B in the cleaning water and thereby remove the water-soluble protective film B from the back side W1b of the wafer W. As a modification, a cleaning apparatus dedicated to the removal of the water-soluble protective film B may be used in place of the protective film forming apparatus 2.

In the protective film removing step, the wafer W of the work set WS is first held under suction through the protective tape T on the holding table 25 in a condition where the water-soluble protective film B is exposed upward. Further, the ring frame F of the work set WS is fixed to the annular table 21 by each clamp 23. Thereafter, the cleaning water nozzle 270 is horizontally moved to the position above the center of the wafer W held under suction on the holding table 25. Thereafter, cleaning water is supplied from the cleaning water source 271 to the cleaning water nozzle 270, and the cleaning water is next sprayed from the cleaning water nozzle 270 toward the center of the wafer W. Further, the holding table 25 is rotated about its vertical axis. In this preferred embodiment, each elevating means 22 is operated to lower the annular table 21 to a predetermined level as illustrated in FIG. 9, so that the ring frame F of the work set WS is lowered to a level lower than that of the wafer W. Accordingly, the cleaning water sprayed to the wafer W can be easily drained away from the work set WS.

Accordingly, the cleaning water is allowed to flow over the entire surface of the water-soluble protective film B formed on each chip C, so that the water-soluble protective film B is dissolved in the cleaning water. Furthermore, a centrifugal force is generated by the rotation of the holding table 25 to thereby make the cleaning water and the water-soluble protective film B dissolved in the cleaning water flow over the back side W1b of the wafer W toward the outer circumference thereof. Finally, the cleaning water containing the water-soluble protective film B is drained to the outside of the protective film forming apparatus 2. Accordingly, the water-soluble protective film B is removed from the side surfaces and the upper surface of each chip C, in which each chip C has the device D. The side surfaces of each chip C correspond to the side surfaces Mc of the cut grooves M surrounding each chip C.

The wafer dividing method according to the present invention includes the cut groove forming step of holding the wafer W through the protective tape T on the chuck table 30, the protective tape T being attached to the front side W2a of the wafer W on which the devices D are formed, and cutting the back side W1b of the wafer W by using the cutting blade 340 as relatively moving the cutting blade 340 and the chuck table 30 along each division line S, thereby forming the cut groove M on the back side W1b of the wafer W along each division line S, each cut groove M having a depth not reaching the front side W2a of the wafer W from the back side W1b thereof. The wafer dividing method further includes the protective film forming step of supplying a water-soluble liquid resin to the back side W1b of the wafer W after performing the cut groove forming step, thereby forming the water-soluble protective film B on the back side W1b of the wafer W including the bottom surface Mb and the side surfaces Mc of each cut groove M. The wafer dividing method further includes the laser cutting step of positioning the focal point of the laser beam on the bottom surface Mb of each cut groove M after performing the protective film forming step, and next applying the laser beam to the bottom surface Mb of each cut groove M along each cut groove M in a condition where the back side W1b of the wafer W is exposed upward, thereby fully cutting the wafer W along each cut groove M in a condition where no debris adheres to the side surfaces Mc of each cut groove M due to the water-soluble protective film B. The wafer dividing method further includes the protective film removing step of spraying cleaning water to the back side W1b of the wafer W after performing the laser cutting step, thereby dissolving the water-soluble protective film B in the cleaning water to remove the water-soluble protective film B from the back side W1b of the wafer W. Accordingly, it is possible to prevent that debris may adhere to the side surfaces of each chip C divided from the wafer W.

The dividing method according to the present invention is not limited to the above preferred embodiment. Further, the configuration of each apparatus illustrated in the attached drawings is merely illustrative and may be suitably modified within the scope where the effect of the present invention can be exhibited.

For example, in the protective film forming step, a water-soluble liquid resin may be sprayed toward the back side W1b of the wafer W to thereby form a water-soluble protective film on the bottom surface Mb and the side surfaces Mc of each cut groove M.

Figure 10:
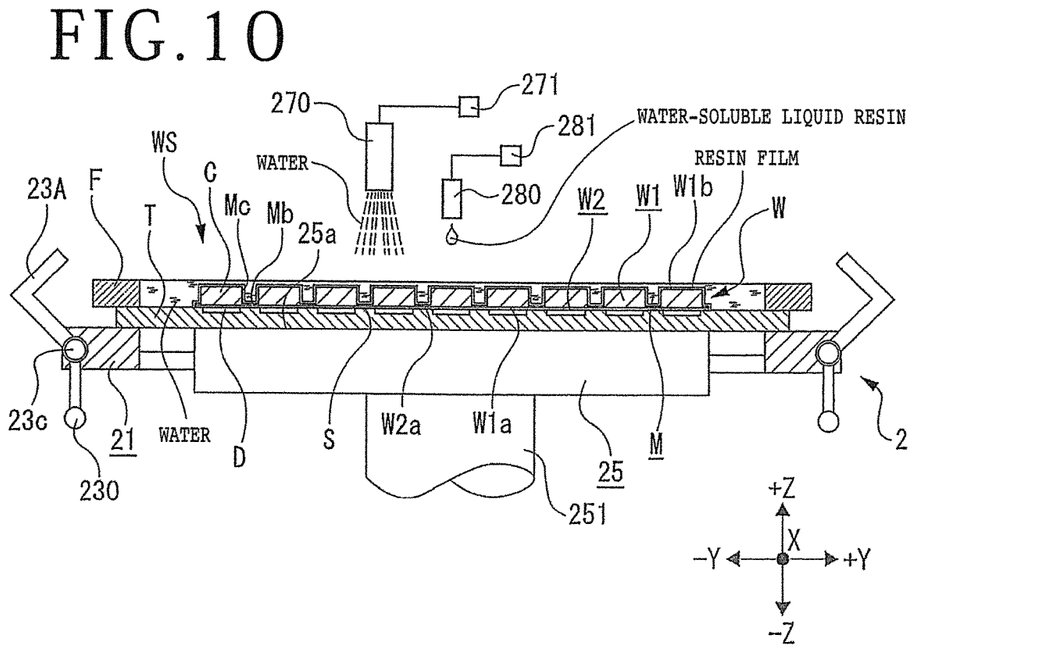
FIG. 10 is a sectional view illustrating a modification of the protective film forming step in a case in which a thickness of the ring frame is larger than that of the wafer, in which an immersing step and a resin film forming step are performed.
Figure 11:
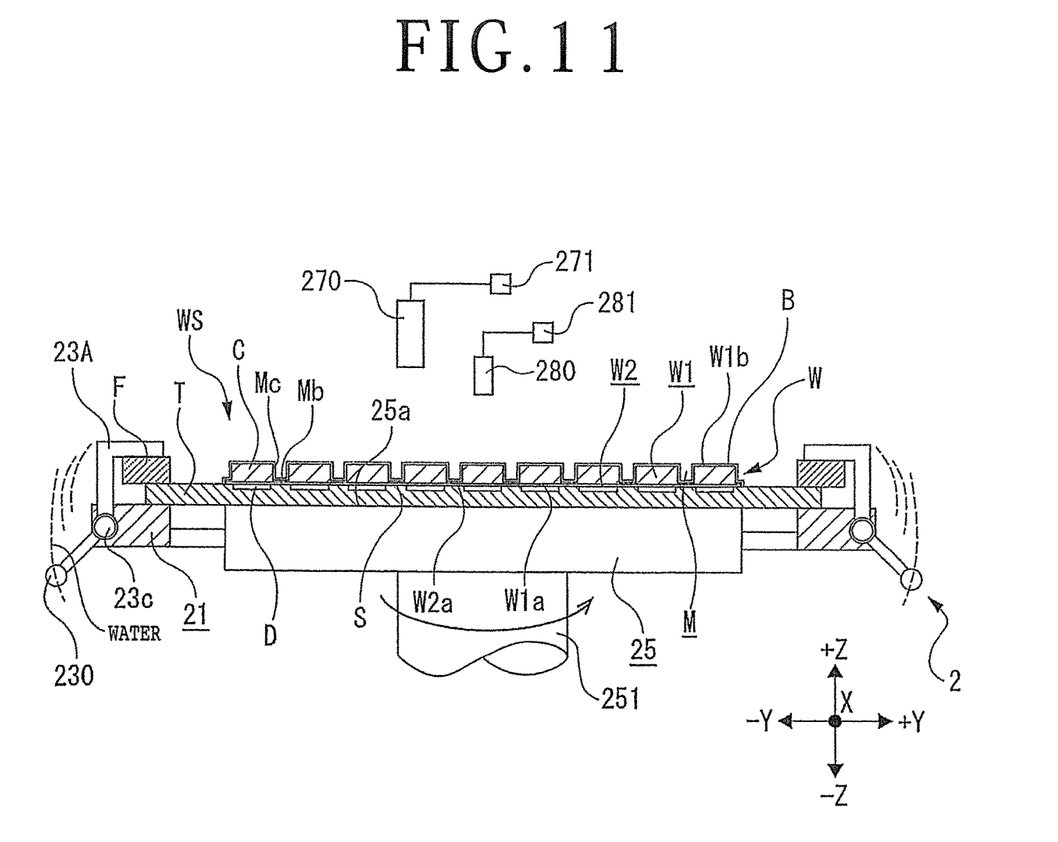
FIG. 11 is a sectional view illustrating a draining step subsequent to the steps illustrated in FIG. 10.

In a case in which a thickness of the ring frame F is larger than a thickness of the wafer W, the protective film forming step may be modified as illustrated in FIGS. 10 and 11. In this modification, the wafer W of the work set WS is held under suction through the protective tape T on the holding surface 25a of the holding table 25, and the ring frame F of the work set WS is held through the protective tape T on the upper surface of the annular table 21 in a condition where the holding surface 25a of the holding table 25 and the upper surface of the annular table 21 are set at the same level as illustrated in FIG. 10. In this condition, the upper surface of the ring frame F is higher in level than the back side W1b (upper surface) of the wafer W, so that the water supplied from the cleaning water nozzle 270 toward the back side W1b of the wafer W can be stored inside the ring frame F, and the wafer W can be immersed in the water stored inside the ring frame F. In other words, the inverted frustoconical space forming step can be omitted in this modification. That is, each elevating means 22 illustrated in FIG. 5 can be omitted.

Thereafter, a water-soluble liquid resin is supplied in the form of drops from the liquid resin nozzle 280 toward the surface of the water stored inside the ring frame F as illustrated in FIG. 10, so that the water-soluble liquid resin is allowed to sink in the water and spread over the back side W1b of the wafer W, thus forming a resin film over the entire surface of the back side W1b of the wafer W. Further, the water-soluble liquid resin is allowed to reach the inside of each cut groove M and spread over the side surfaces Mc of each cut groove M so as to extend downward. Further, the water-soluble liquid resin also spreads over the bottom surface Mb of each cut groove M.

Thereafter, as illustrated in FIG. 11, the rotating shaft 251 is rotated about its axis to thereby rotate the holding table 25 about the axis of the rotating shaft 251. Accordingly, both the holding table 25 and the annular table 21 are rotated together to thereby generate a centrifugal force. Accordingly, the water stored inside the ring frame F can be drained by this centrifugal force. In this modification, a plurality of clamps 23A may be provided on the outer circumference of the annular table 21, in which each clamp 23A is configured to fix the ring frame F without using a rotary actuator or the like. More specifically, a rotating shaft 23c is provided at the lower end of each clamp 23A to rotate each clamp 23A about a horizontal axis, and a pendulum (weight) 230 is connected at one end thereof to the rotating shaft 23c so as to vertically swing from a vertical position (−Z direction) toward a horizontal position in association with the rotation of the holding table 25 and the annular table 21. That is, when the holding table 25 and the annular table 21 are rotated together about the axis of the rotating shaft 251, a centrifugal force is applied to each pendulum 230, so that each pendulum 230 swings from the vertical position toward the horizontal position as illustrated in FIG. 11. As a result, the rotating shaft 23c is rotated by this swing motion of each pendulum 230, thereby rotating each clamp 23A about the axis of the rotating shaft 23c toward the center of the annular table 21. Thus, the ring frame F is held between each clamp 23A and the annular table 21.

As mentioned above, the water stored inside the ring frame F is completely drained by the rotation of the holding table 25 and the annular table 21. Accordingly, the resin film formed on the bottom surface Mb of each cut groove M, the side surfaces Mc of each cut groove M (the side surfaces of each chip C), and the upper surface of each chip C are dried to become a water-soluble protective film B as illustrated in FIG. 11.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A wafer dividing method for dividing a wafer along a plurality of crossing division lines, the division lines being formed on a front side of the wafer to thereby define a plurality of separate regions where a plurality of devices are individually formed, by using cutting means having a cutting blade for cutting the wafer held on a chuck table and laser processing means for applying a laser beam to the wafer to thereby process the wafer, the laser beam having an absorption wavelength to the wafer, the wafer dividing method comprising:

a cut groove forming step of holding the wafer through a protective tape on the chuck table, the protective tape being attached to the front side of the wafer on which the devices are formed, and cutting a back side of the wafer by using the cutting blade along each division line, thereby forming a cut groove on the back side of the wafer along each division line, each cut groove having a depth not reaching the front side of the wafer from the back side thereof;

a protective film forming step of supplying a water-soluble liquid resin to the back side of the wafer after performing the cut groove forming step, thereby forming a water-soluble protective film on the back side of the wafer including a bottom surface and side surfaces of each cut groove;

a laser cutting step of positioning a focal point of the laser beam on the bottom surface of each cut groove after performing the protective film forming step, and next applying the laser beam to the bottom surface of each cut groove on which the water-soluble protective film is formed along each cut groove in a condition where the back side of the wafer is exposed upward, thereby fully cutting the wafer along each cut groove; and a protective film removing step of spraying cleaning water to the back side of the wafer after performing the laser cutting step, thereby dissolving the water-soluble protective film in the cleaning water to remove the water-soluble protective film from the back side of the wafer.

2. The wafer dividing method according to claim 1, further comprising:

a preparing step of preparing a work set before performing the cut groove forming step, the work set being composed of the wafer, a ring frame having an inside opening for accommodating the wafer, and the protective tape attached to the front side of the wafer located in the inside opening of the ring frame in a condition where a peripheral portion of the protective tape is supported to the ring frame.

3. The wafer dividing method according to claim 2, wherein the protective film forming step includes the substeps of:

an inverted frustoconical space forming step of positioning the ring frame of the work set at a level higher than that of the wafer to thereby form an inverted frustoconical space as defined by the wafer, the protective tape, and the ring frame in such a manner that a base of the inverted frustoconical space is formed by the wafer and a side wall of the inverted frustoconical space is formed by the protective tape, an immersing step of supplying water into the inverted frustoconical space to store the water in the inverted frustoconical space until the wafer is immersed in the water stored in the inverted frustoconical space, a resin film forming step of supplying the water-soluble liquid resin in the form of drops into the water stored in the inverted frustoconical space in the immersing step, the water-soluble liquid resin having a specific gravity larger than that of the water, thereby spreading the water-soluble liquid resin over the back side of the wafer including each cut groove to form a resin film, and a draining step of positioning the ring frame at a level lower than that of the wafer after performing the resin film forming step to thereby drain the water stored in the inverted frustoconical space in the immersing step, thereby forming the water-soluble protective film from the resin film formed on the back side of the wafer.

4. The wafer dividing method according to claim 1, wherein the protective film forming step includes:

an immersing step of adding water to immerse the wafer; and a draining step of rotating a holding table and an annular table together to thereby generate a centrifugal force to drain the water.

* * * * *